US006627323B2

(12) United States Patent
Nagaraj et al.

(10) Patent No.: US 6,627,323 B2
(45) Date of Patent: Sep. 30, 2003

(54) THERMAL BARRIER COATING RESISTANT TO DEPOSITS AND COATING METHOD THEREFOR

(75) Inventors: Bangalore Aswatha Nagaraj, West Chester, OH (US); Jeffrey Lawrence Williams, Cincinnati, OH (US); John Frederick Ackerman, Laramie, WY (US)

(73) Assignee: General Electric Company, Schenectady, NY (US)

( * ) Notice: Subject to any disclaimer, the term of this patent is extended or adjusted under 35 U.S.C. 154(b) by 12 days.

(21) Appl. No.: 10/079,036

(22) Filed: Feb. 19, 2002

(65) Prior Publication Data

US 2003/0157361 A1 Aug. 21, 2003

(51) Int. Cl.[7] .......................... B32B 15/04; F03B 3/12; C23C 16/00

(52) U.S. Cl. ....................... 428/469; 428/697; 428/699; 428/701; 428/702; 428/472; 428/336; 416/241 B; 427/250; 427/255.19; 427/255.21; 427/255.23; 427/255.31; 427/255.7; 204/192.16

(58) Field of Search ................................ 428/469, 632, 428/633, 701, 702, 697, 699, 472, 336; 416/241 B; 427/255.19, 255.21, 255.23, 255.31, 255.32, 255.34, 250, 255.7, 299, 327; 204/192.16

(56) References Cited

U.S. PATENT DOCUMENTS 5,512,382 A * 4/1996 Strangman
5,660,885 A 8/1997 Hasz et al.
5,871,820 A 2/1999 Hasz et al.
5,914,189 A 6/1999 Hasz et al.

FOREIGN PATENT DOCUMENTS

JP 411029380 * 2/1999

* cited by examiner

*Primary Examiner*—Deborah Jones
*Assistant Examiner*—Jennifer McNeil
(74) *Attorney, Agent, or Firm*—David L. Narciso; Gary M. Hartman; Domenica N. S. Hartman

(57) ABSTRACT

A protective coating system and method for protecting a thermal barrier coating from CMAS infiltration. The coating system comprises inner and outer alumina layers and a platinum-group metal layer therebetween. The outer alumina layer is intended as a sacrificial layer that reacts with molten CMAS, forming a compound with a melting temperature significantly higher than CMAS. As a result, the reaction product of the outer alumina layer and CMAS resolidifies before it can infiltrate the TBC. The platinum-group metal layer is believed to serve as a barrier to infiltration of CMAS into the TBC, while the inner alumina layer appears to enhance the ability of the platinum-group metal layer to prevent CMAS infiltration.

38 Claims, 1 Drawing Sheet

THERMAL BARRIER COATING RESISTANT TO DEPOSITS AND COATING METHOD THEREFOR

CROSS REFERENCE TO RELATED APPLICATIONS

Not applicable.

STATEMENT REGARDING FEDERALLY SPONSORED RESEARCH

Not applicable.

BACKGROUND OF THE INVENTION

1. Field of the Invention

This invention generally relates to coatings for components exposed to high temperatures, such as the hostile thermal environment of a gas turbine engine. More particularly, this invention is directed to a protective coating system for a thermal barrier coating on a gas turbine engine component, in which the protective coating system is resistant to infiltration by contaminants present in the operating environment of a gas turbine engine.

2. Description of the Related Art

Hot section components of gas turbine engines are often protected by a thermal barrier coating (TBC), which reduces the temperature of the underlying component substrate and thereby prolongs the service life of the component. Ceramic materials and particularly yttria-stabilized zirconia (YSZ) are widely used as TBC materials because of their high temperature capability, low thermal conductivity, and relative ease of deposition by plasma spraying, flame spraying and physical vapor deposition (PVD) techniques. Air plasma spraying (APS) has the advantages of relatively low equipment costs and ease of application and masking, while TBC's employed in the highest temperature regions of gas turbine engines are often deposited by PVD, particularly electron-beam PVD (EBPVD), which yields a strain-tolerant columnar grain structure. Similar columnar microstructures can be produced using other atomic and molecular vapor processes.

To be effective, a TBC must strongly adhere to the component and remain adherent throughout many heating and cooling cycles. The latter requirement is particularly demanding due to the different coefficients of thermal expansion (CTE) between ceramic materials and the substrates they protect, which are typically superalloys, though ceramic matrix composite (CMC) materials are also used. An oxidation-resistant bond coat is often employed to promote adhesion and extend the service life of a TBC, as well as protect the underlying substrate from damage by oxidation and hot corrosion attack. Bond coats used on superalloy substrates are typically in the form of an overlay coating such as MCrAlX (where M is iron, cobalt and/or nickel, and X is yttrium or another rare earth element), or a diffusion aluminide coating. During the deposition of the ceramic TBC and subsequent exposures to high temperatures, such as during engine operation, these bond coats form a tightly adherent alumina ($Al_2O_3$) layer or scale that adheres the TBC to the bond coat.

The service life of a TBC system is typically limited by a spallation event driven by bond coat oxidation and the resulting thermal fatigue. In addition to the CTE mismatch between a ceramic TBC and a metallic substrate, spallation can be promoted as a result of the TBC being contaminated with compounds found within a gas turbine engine during its operation. Notable contaminants include such oxides as calcia, magnesia, alumina and silica, which when present together at elevated temperatures form a compound referred to herein as CMAS. CMAS has a relatively low melting eutectic (about 1190° C.) that when molten is able to infiltrate to the cooler subsurface regions of a TBC, where it resolidifies. During thermal cycling, the CTE mismatch between CMAS and the TBC promotes spallation, particularly TBC deposited by PVD and APS due to the ability of the molten CMAS to penetrate their columnar and porous grain structures, respectively. Another detriment of CMAS is that the bond coat and substrate underlying the TBC are susceptible to corrosion attack by alkali deposits associated with the infiltration of CMAS.

Various studies have been performed to find coating materials that are resistant to infiltration by CMAS. Notable examples are U.S. Pat. Nos. 5,660,885, 5,871,820 and 5,914,189 to Hasz et al., which disclose three types of coatings to protect a TBC from CMAS-related damage. These protective coatings are classified as being impermeable, sacrificial or non-wetting to CMAS. Impermeable coatings are defined as inhibiting infiltration of molten CMAS, and include silica, tantala, scandia, alumina, hafnia, zirconia, calcium zirconate, spinels, carbides, nitrides, silicides, and noble metals such as platinum. Sacrificial coatings are said to react with CMAS to increase the melting temperature or the viscosity of CMAS, thereby inhibiting infiltration. Suitable sacrificial coating materials include silica, scandia, alumina, calcium zirconate, spinels, magnesia, calcia and chromia. As its name implies, a non-wetting coating is non-wetting to molten CMAS, with suitable materials including silica, hafnia, zirconia, beryllium oxide, lanthana, carbides, nitrides, silicides, and noble metals such as platinum. According to the Hasz et al. patents, an impermeable coating or a sacrificial coating is deposited directly on the TBC, and may be followed by a layer of impermeable coating (if a sacrificial coating was deposited first), sacrificial coating (if the impermeable coating was deposited first), or non-wetting coating. If used, the non-wetting coating is the outermost coating of the protective coating system.

While the coating systems disclosed by Hasz et al. are effective in protecting a TBC from damage resulting from CMAS infiltration, further improvements would be desirable.

BRIEF SUMMARY OF THE INVENTION

The present invention generally provides a protective coating system and method for protecting a thermal barrier coating (TBC) on a component used in a high-temperature environment, such as the hot section of a gas turbine engine. The invention is particularly directed to a protective coating system that significantly reduces if not prevents the infiltration of CMAS into the underlying TBC.

The protective coating system of this invention comprises inner and outer alumina layers and a platinum-group metal layer. The inner alumina layer is deposited on the thermal barrier coating, the platinum-group metal layer is deposited on the inner alumina layer, and the outer alumina layer is deposited on the platinum-group metal layer, so that the platinum-group metal layer is encased between the inner and outer alumina layers. The outer alumina layer is intended as a sacrificial layer that reacts with molten CMAS, forming a compound with a melting temperature that is significantly higher than CMAS. As a result, the reaction product of the outer alumina layer and CMAS resolidifies before it can infiltrate the TBC. The platinum-group metal layer is believed to serve as a barrier to infiltration of CMAS into the inner alumina layer and, therefore, the TBC. Notably, the inner alumina layer beneath the platinum-group metal layer appears to enhance the ability of the platinum-group metal layer to prevent infiltration of CMAS. In other words, the platinum-group metal layer is better able to perform as a barrier to CMAS infiltration if it is deposited on an alumina layer than if it were deposited directly on the TBC.

In view of the above, the protective coating system of this invention is able to increase the temperature capability of a TBC by reducing the vulnerability of the TBC to spallation and the underlying substrate to corrosion from CMAS contamination. The layers of the protective coating system can be preferentially deposited on limited surface areas of a component more susceptible to CMAS contamination. In this manner, the additional weight and cost incurred by the protective coating system can be minimized. Finally, the protective coating system of this invention can be applied during the process of rejuvenating a TBC on a component returned from field service, thereby further extending the life of a TBC.

Other objects and advantages of this invention will be better appreciated from the following detailed description.

DETAILED DESCRIPTION OF THE INVENTION

Figure 1:
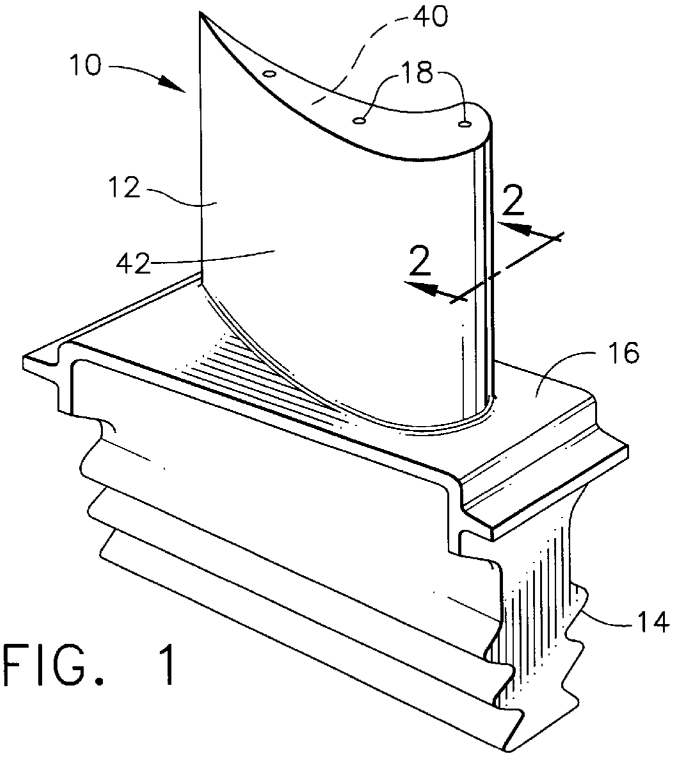
FIG. 1 is a perspective view of a high pressure turbine blade.

The present invention will be described in reference to a high pressure turbine blade 10 shown in FIG. 1, though the invention is generally applicable to any component that operates within a thermally and chemically hostile environment. The blade 10 generally includes an airfoil 12 against which hot combustion gases are directed during operation of the gas turbine engine, and whose surfaces are therefore subjected to severe attack by oxidation, hot corrosion and erosion. The airfoil 12 is anchored to a turbine disk (not shown) with a dovetail 14 formed on a root section 16 of the blade 10. Cooling holes 18 are present in the airfoil 12 through which bleed air is forced to transfer heat from the blade 10.

Figure 2:
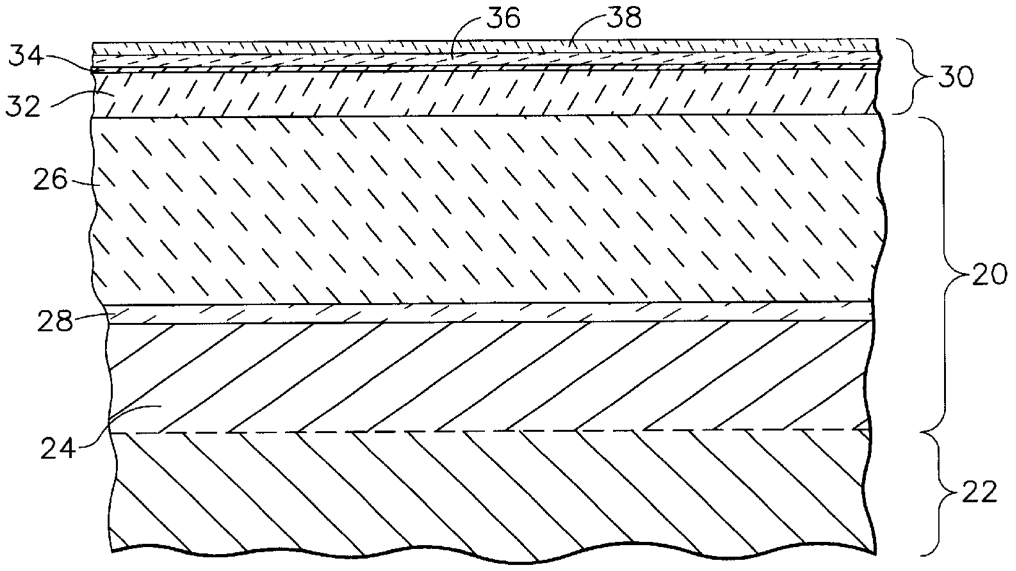
FIG. 2 is a cross-sectional view of the blade of FIG. 1 along line 2—2, and shows a protective coating overlaying a thermal barrier coating in accordance with this invention.

The surface of the airfoil 12 is protected by a TBC system 20, represented in FIG. 2 as including a metallic bond coat 24 that overlies the surface of a substrate 22, the latter of which may be a superalloy and typically the base material of the blade 10. As widely practiced with TBC systems for components of gas turbine engines, the bond coat 24 is preferably an aluminum-rich composition, such as an overlay coating of an MCrAlX alloy or a diffusion coating such as a diffusion aluminide or a diffusion platinum aluminide, all of which are known in the art. Aluminum-rich bond coats develop an aluminum oxide (alumina) scale 28, which is grown by oxidation of the bond coat 24. The alumina scale 28 chemically bonds a TBC 26, formed of a thermal-insulating material, to the bond coat 24 and substrate 22. The TBC 26 of FIG. 2 is represented as having a strain-tolerant microstructure of columnar grains. As known in the art, such columnar microstructures can be achieved by depositing the TBC 26 using a physical vapor deposition (PVD) technique, such as EBPVD. The invention is also applicable to noncolumnar TBC deposited by such methods as plasma spraying, including air plasma spraying (APS). A TBC of this type is in the form of molten "splats," resulting in a microstructure characterized by irregular flattened grains and a degree of inhomogeneity and porosity.

As with prior art TBC's, the TBC 26 of this invention is intended to be deposited to a thickness that is sufficient to provide the required thermal protection for the underlying substrate 22 and blade 10. A suitable thickness is generally on the order of about 75 to about 300 micrometers. A preferred material for the TBC 26 is an yttria-stabilized zirconia (YSZ), a preferred composition being about 3 to about 8 weight percent yttria, though other ceramic materials could be used, such as nonstabilized zirconia, or zirconia partially or fully stabilized by magnesia, ceria, scandia or other oxides.

Of particular interest to the present invention is the susceptibility of TBC materials, including YSZ, to attack by CMAS. As discussed previously, CMAS is a relatively low melting eutectic that when molten is able to infiltrate columnar and porous TBC materials, and subsequently resolidify to promote spallation during thermal cycling. To address this concern, the TBC 26 in FIG. 2 is shown as being overcoated by a protective coating system 30 of this invention. As the outermost layer on the blade 10, the protective coating system 30 serves as a barrier to CMAS infiltration of the underlying TBC 26. The protective coating system 30 is shown in FIG. 2 as comprising four discrete layers 32, 34, 36 and 38. The innermost layer 32 and the third layer 36 of the coating system 30 are formed of alumina ($Al_2O_3$). The layer 34 between the alumina layers 32 and 36 is formed of a platinum-group metal, which includes platinum, ruthenium, rhodium, palladium, osmium and iridium. The outermost layer 38 is an optional member of the coating system 30, and is intended to provide a nonstick surface to which CMAS will not readily wet and bond. A particularly suitable material for the outermost layer 38 is believed to be tantala, though it is foreseeable that other materials with similar nonstick properties could be used. A suitable thickness for the nonstick layer 38 is about 0.5 to about 5 micrometers, more preferably about 0.5 to about 2 micrometers.

As represented in FIG. 2, the alumina layers 32 and 36 have dense microstructures as a result of being deposited by PVD, chemical vapor deposition (CVD) or another suitable technique known in the art. The function of the inner and outer alumina layers 32 and 36 is to serve as sacrificial layers, reacting with molten CMAS that infiltrates the protective coating system 30 to form one or more refractory phases with higher melting temperatures than CMAS. In effect, the alumina content of CMAS is increased above the eutectic point, yielding a modified CMAS with a higher melting and/or crystallization temperature. As a result, the reaction product of the inner and outer alumina layers 32 and 36 and CMAS tends to resolidify before infiltrating the TBC 26. A suitable thickness for the outer alumina layer 36 is on the order of about 0.5 to about 5 micrometers, more preferably about 0.5 to about 2 micrometers, while a suitable thickness for the inner alumina layer 32 is believed to be about 0.5 to about 50 micrometers, more preferably about 5 to about 10 micrometers.

The platinum-group metal layer 34 is believed to serve as a barrier to infiltration of CMAS into the inner alumina layer 32, thus enhancing the ability of the inner alumina layer 32 to react with CMAS. A suitable method for depositing the metal layer 34 is again a CVD or PVD technique such as sputtering. The platinum-group metal layer 34 is preferably entirely covered by the outer alumina layer 36, such that platinum-group metal is not present at the external surface of the coating system 30. With this arrangement, the outer alumina layer 36 serves to protect the platinum-group metal layer 34 from degradation. Importantly, the presence of the inner alumina layer 32 beneath the platinum-group metal layer 34 appears to enhance the ability of the platinum-group metal layer 34 to prevent infiltration of CMAS. In other words, improved resistant to CMAS infiltration appears to be obtained if the platinum-group metal layer 34 is encased between the alumina layers 32 and 34, in comparison to a coating system in which the platinum-group metal layer is directly deposited on a TBC or is the outermost layer of the coating system. In its role as a barrier, a suitable thickness for the platinum-group metal layer 34 is believed to be about 0.1 to about 2 micrometers, more preferably about 0.1 to about 0.5 micrometers. To promote the adhesion of the coating system 30, the surface of the TBC 26 is preferably polished prior to deposition of the inner alumina layer 32. A suitable surface finish is about 30 micro-inches (about 0.75 micrometers) Ra or less.

There are various opportunities for making use of the benefits of the protective coating system 30 of this invention. For example, the coating system 30 can be applied to newly manufactured components that have not been exposed to service. Alternatively, the coating system 30 can be applied to a component that has seen service, and whose TBC must be cleaned and rejuvenated before being returned to the field. In the latter case, applying the coating system 30 to the TBC can significantly extend the life of the component beyond that otherwise possible if the TBC was not protected by the coating system 30. In a preferred embodiment, the coating system 30 is deposited only on those surfaces of a component that are particularly susceptible to damage from CMAS infiltration. In the case of the blade 10 shown in FIG. 1, of particular interest is often the concave (pressure) surface 40 of the airfoil 12, which is can be significantly more susceptible to attack than the convex (suction) surface 42 as a result of aerodynamic considerations. According to the invention, the layers 32, 34, 36 and optional layer 38 of the coating system 30 can be selectively deposited on the concave surface 40 of the airfoil 12, thus minimizing the additional weight and cost of the coating system 30. For this purpose, preferred deposition techniques include sputtering and directed PVD. Multiple blades can be simultaneously coated by positioning their convex surfaces back-to-back, so that their convex surfaces effectively mask each other and their concave surfaces face outward for coating. Deposition by sputtering or directed PVD can then be performed to deposit the coating system 30 essentially exclusively on the exposed concave blade surfaces. While the concave surface 40 of the airfoil 12 may be of particular interest, circumstances may exist where other surface areas of the blade 10 are of concern, such as the leading edge of the airfoil 12 or the region of the convex surface of the airfoil 12 near the leading edge.

While the invention has been described in terms of a preferred embodiment, it is apparent that other forms could be adopted by one skilled in the art, such as by substituting other TBC, bond coat and substrate materials, or by utilizing other methods to deposit and process the protective coating system. Accordingly, the scope of the invention is to be limited only by the following claims.

What is claimed is:

1. A component having a thermal barrier coating on a surface thereof, the component comprising a protective coating system overlying the thermal barrier coating, the protective coating system comprising inner and outer alumina layers and a platinum-group metal layer encased therebetween.

2. A component according to claim 1, wherein the thermal barrier coating is yttria-stabilized zirconia.

3. A component according to claim 1, wherein the protective coating system consists of the inner and outer alumina layers and the platinum-group metal layer.

4. A component according to claim 1, wherein the platinum-group metal layer consists essentially of platinum.

5. A component according to claim 1, wherein the component is an airfoil component of a gas turbine engine.

6. A component according to claim 5, wherein the component has a concave surface, a convex surface and a leading edge therebetween, and the protective coating system overlies only one of the concave surface, the convex surface or the leading edge.

7. A component according to claim 1, wherein the inner alumina layer has a thickness of about 0.5 to about 50 micrometers, the platinum-group metal layer has a thickness of about 0.1 to about 2 micrometers, and the outer alumina layer has a thickness of about 0.5 to about 5 micrometers.

8. A component according to claim 1, wherein the protective coating system further comprises a layer of tantala overlying the outer alumina layer.

9. A component according to claim 8, wherein the tantala layer has a thickness of about 0.5 to about 5 micrometers.

10. A gas turbine engine component having a thermal barrier coating of yttria-stabilized zirconia, the component comprising an outer protective coating system overlying the thermal barrier coating, the protective coating system comprising a platinum-group metal layer encased between inner and outer alumina layers having columnar grain structures, such that platinum-group metal is not present at an external surface of the component defined by the protective coating system.

11. A component according to claim 10, wherein the protective coating system consists of the inner and outer alumina layers and the platinum-group metal layer, and the outer alumina layer defines the external surface of the component.

12. A component according to claim 10, wherein the platinum-group metal layer consists essentially of platinum.

13. A component according to claim 10, wherein the component is an airfoil component having a concave surface, a convex surface and a leading edge therebetween, and the protective coating system overlies only one of the concave surface, the convex surface or the leading edge.

14. A component according to claim 10, wherein the inner alumina layer has a thickness of about 5 to about 10 micrometers, the platinum-group metal layer has a thickness of about 0.1 to about 0.5 micrometers, and the outer alumina layer has a thickness of about 0.5 to about 2 micrometers.

15. A component according to claim 10, wherein the protective coating system further comprises a layer of tantala overlying the outer alumina layer, and the tantala layer defines the external surface of the component.

16. A component according to claim 15, wherein the tantala layer has a thickness of about 0.5 to about 2 micrometers.

17. A component according to claim 10, wherein CMAS has infiltrated the columnar grains of the outer alumina layer, the platinum-group metal layer being a barrier to infiltration of the CMAS into the inner alumina layer.

18. A method of protecting a thermal barrier coating on a surface of a component, the method comprising the step of depositing a protective coating system on the thermal barrier coating, the protective coating system comprising an inner alumina layer deposited on the thermal barrier coating, a platinum-group metal layer deposited on the inner alumina layer, and an outer alumina layer deposited on the platinum-group metal layer so that the platinum-group metal layer is encased between the inner and outer alumina layers.

19. A method according to claim 18, wherein the thermal barrier coating is yttria-stabilized zirconia.

20. A method according to claim 18, wherein the protective coating system consists of the inner and outer alumina layers and the platinum-group metal layer.

21. A method according to claim 18, wherein the platinum-group metal layer consists essentially of platinum.

22. A method according to claim 18, wherein the component is an airfoil component of a gas turbine engine.

23. A method according to claim 22, wherein the component has a concave surface, a convex surface and a leading edge therebetween, and the protective coating system is selectively deposited on only one of the concave surface, the convex surface or the leading edge.

24. A method according to claim 23, wherein each layer of the protective coating system is deposited by sputtering or a directed vapor deposition process, the inner and outer alumina layers having columnar grain structures.

25. A method according to claim 22, wherein the protective coating system is deposited on the thermal barrier coating after the component has been removed from the gas turbine engine and the thermal barrier coating has been cleaned.

26. A method according to claim 18, wherein the protective coating system is deposited on the thermal barrier coating after polishing the thermal barrier coating-to-have a surface finish of not greater than 0.75 micrometers Ra.

27. A method according to claim 18, wherein the inner alumina layer is deposited to a thickness of about 0.5 to about 50 micrometers, the platinum-group metal layer is deposited to a thickness of about 0.1 to about 2 micrometers, and the outer alumina layer is deposited to a thickness of about 0.5 to about 5 micrometers.

28. A method according to claim 18, further comprising the step of depositing a layer of tantala on the outer alumina layer.

29. A method according to claim 28, wherein the tantala layer has a thickness of about 0.5 to about 2 micrometers.

30. A method of forming a protective coating system on a thermal barrier coating of yttria-stabilized zirconia that is present on a gas turbine engine component, the protective coating system defining an external surface of the component, the method comprising the steps of:

depositing the inner alumina layer on the thermal barrier coating so that the inner alumina layer has a columnar grain structure;

depositing the platinum-group metal layer on the inner alumina layer; and depositing the outer alumina layer on the platinum-group metal layer so that the outer alumina layer has a columnar grain structure, the platinum-group metal layer is encased between the inner and outer alumina layers, and platinum-group metal is not present at the external surface of the component.

31. A method according to claim 30, wherein the protective coating system consists of the inner and outer alumina layers and the platinum-group metal layer, and the outer alumina layer defines the external surface of the component.

32. A method according to claim 30, wherein the platinum-group metal layer consists essentially of platinum.

33. A method according to claim 30, wherein the protective coating system further comprises a layer of tantala deposited on the outer alumina layer so that the tantala layer defines the external surface of the component.

34. A method according to claim 30, wherein CMAS has infiltrated the columnar grains of the outer alumina layer, and the platinum-group metal layer serves as a barrier to infiltration of the CMAS into the inner alumina layer.

35. A method according to claim 30, wherein the component is an airfoil component having a concave surface, a convex surface and a leading edge therebetween, and the protective coating system is selectively deposited on only one of the concave surface, the convex surface or the leading edge.

36. A method according to claim 35, wherein each layer of the protective coating system is deposited by sputtering or a directed vapor deposition process.

37. A method according to claim 30, wherein the protective coating system is deposited on the thermal barrier coating after the component has been removed from a gas turbine engine and the thermal barrier coating has been cleaned.

38. A method according to claim 30, wherein the protective coating system is deposited on the thermal barrier coating after polishing the thermal barrier coating to have a surface finish of not greater than 0.75 micrometers Ra.

* * * * *